(12) United States Patent
Woo

(10) Patent No.: US 11,342,200 B2
(45) Date of Patent: May 24, 2022

(54) WAFER TREATMENT DEVICE

(71) Applicant: PICO & TERA CO., LTD., Suwon-si (KR)

(72) Inventor: Bum Je Woo, Yongin-si (KR)

(73) Assignee: PICO & TERA CO., LTD., Suwon-si (KR)

( * ) Notice: Subject to any disclaimer, the term of this patent is extended or adjusted under 35 U.S.C. 154(b) by 595 days.

(21) Appl. No.: 14/760,345

(22) PCT Filed: Oct. 31, 2013

(86) PCT No.: PCT/KR2013/009800
§ 371 (c)(1),
(2) Date: Jul. 10, 2015

(87) PCT Pub. No.: WO2014/109466
PCT Pub. Date: Jul. 17, 2014

(65) Prior Publication Data
US 2015/0364346 A1 Dec. 17, 2015

(30) Foreign Application Priority Data
Jan. 14, 2013 (KR) ........................ 10-2013-0003948

(51) Int. Cl.
*H01L 21/67* (2006.01)
*H01L 21/677* (2006.01)
(Continued)

(52) U.S. Cl.
CPC ........ *H01L 21/67028* (2013.01); *F24F 7/007* (2013.01); *H01L 21/67017* (2013.01);
(Continued)

(58) Field of Classification Search
CPC ......... H01L 21/67393; H01L 21/67386; H01L 21/67389; H01L 21/67326
See application file for complete search history.

(56) References Cited

U.S. PATENT DOCUMENTS 6,044,874 A * 4/2000 Saga ................. H01L 21/67393
141/48
6,106,213 A * 8/2000 Denker ............ H01L 21/67772
414/217

(Continued)

FOREIGN PATENT DOCUMENTS

| JP | 11307623 | 11/1999 |
|---|---|---|
| KR | 1020110041445 | 4/2011 |
| KR | 101075171 | 10/2011 |

OTHER PUBLICATIONS

International Search Report—PCT/KR2013/009800 dated Feb. 7, 2014.

*Primary Examiner* — Parviz Hassanzadeh
*Assistant Examiner* — Nathan K Ford

(57) ABSTRACT

Provided is an exhaust system of a wafer treatment device, and the main purpose thereof is to prevent secondary contamination of a wafer by not allowing foreign substances such as process gases and fumes and the like floating in the wafer treatment device to make contact with the wafer in a side storage. The wafer treatment device comprises: a cleaning device for removing foreign substances remaining on a wafer; and an exhaust device comprising first and second main bodies at the lower side of a main body of the wafer treatment device. By not allowing foreign substances such as process gases and fumes and the like floating in the wafer treatment device to make contact with a wafer in a side storage, secondary contamination of the wafer is prevented.

3 Claims, 11 Drawing Sheets

(51) Int. Cl.
*F24F 7/007* (2006.01)
*H01L 21/673* (2006.01)
*F24F 7/00* (2021.01)

(52) U.S. Cl.
CPC .. *H01L 21/67389* (2013.01); *H01L 21/67393* (2013.01); *H01L 21/67781* (2013.01); *F24F 2007/001* (2013.01)

(56) References Cited

U.S. PATENT DOCUMENTS

| | | | |
|---|---|---|---|
| 2004/0182472 A1* | 9/2004 | Aggarwal | H01L 21/67393 141/98 |
| 2008/0173238 A1* | 7/2008 | Nakashima | C23C 16/345 118/723 R |
| 2011/0005967 A1* | 1/2011 | Gregerson | H01L 21/67383 206/711 |

* cited by examiner

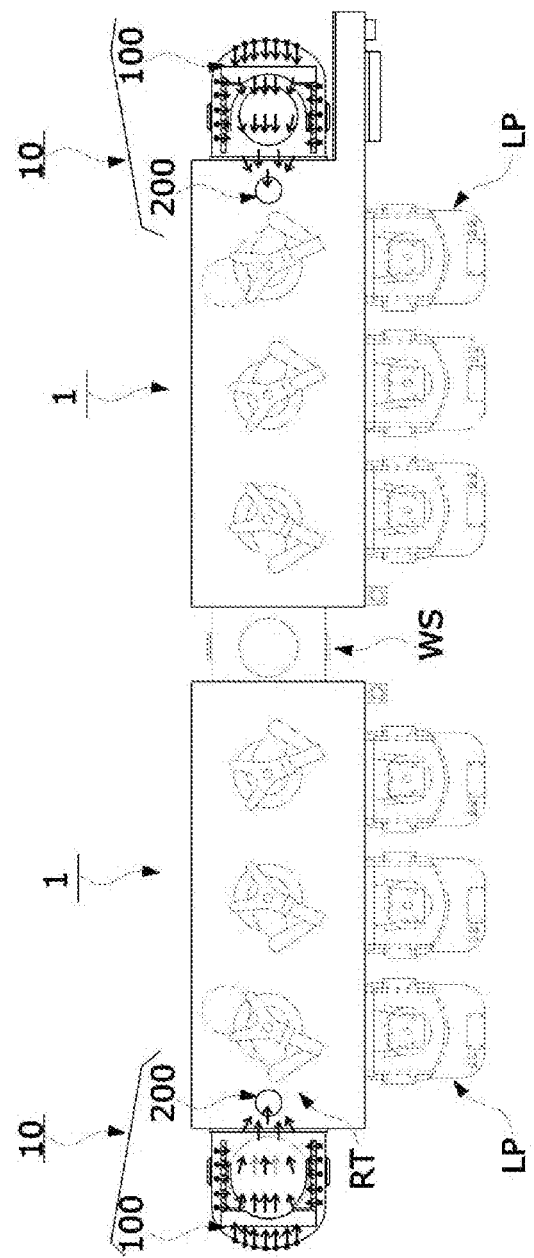

WAFER TREATMENT DEVICE

TECHNICAL FIELD

The present invention relates to an equipment front end module (EFEM), more particularly, to an exhaust system of a wafer treatment device which minimizes contact between the air remaining inside the EFEM and the wafer in order to prevent wafer contamination caused by a small amount of residual gas floating or remaining inside the EFEM and the wafer.

BACKGROUND ART

Generally, a wafer (WF) which is an essential component of a semiconductor device sequentially undergoes a series of processes including: an impurity ion implantation process wherein impurity ions of the Group 3 metals (3B) or Group 5 metals (5B) are injected in a semiconductor process equipment (BS) (shown in FIG. 1B); a thin film deposition process wherein a material layer is formed on a semiconductor substrate; an etching process wherein the material layer is etched away except an area of predetermined pattern; and a chemical mechanical polishing process wherein surface polishing of the wafer is performed for removing the surface-steps all at once after depositing interlayer insulation film and the like on the upper side of the wafer.

The process gases and the fume and the like which are by-products of the processing and remaining on the wafer which has undergone such processes are removed using the wafer treatment device, the Equipment Front End Module (EFEM) (hereinafter, referred to as 'treatment device (EM)'), as illustrated in FIGS. 1A and 1B.

A treatment device (EM) of the prior art comprises a main body (MB), transfer devices (ME), a side storage (ST), and load ports (LP).

As illustrated, the main body (MB) is shaped like a closed box wherein an exhaust device (FS) is provided on the upper side thereof, and transfer devices (ME) comprising a robot arm is provided inside thereof.

An exhaust device (FS) commonly called "Fan Filter Unit (FFU)" is a ceiling-mounted type unit and comprises a fan (FN) and a filter (FT).

The fan (FN) is rotated by an electric motor which is not shown here, and the filter (FT) can collect 99.99% of about 0.3 μm sized microdust, therefore high cleanliness inside the foresaid treatment device (EM) can be maintained.

A side storage (ST) is provided at each end of the main body (MB), wherein a wafer cassette (WC) is provided in order to stack a number of wafers (WF) which had been completed processes in the foresaid semiconductor process equipment (BS).

After completion of stacking of wafers (WF) inside the wafer cassette (WC), usually by 25 to 30, process gases and fume and the like generated through each of the above described processes are removed.

That is, wind power generated from the exhaust device (FS) provided at the upper part of the main body (MB) removes process gases and fume (hereinafter referred to as 'foreign substances') on the wafers (WF) stored inside the foresaid side storage (ST) by the pressure applied to the exhaust port wherein a pump not shown here is provided.

The wafers (WF), from which foreign substances are removed, are being stacked inside the load port (LP) plurally provided in lengthwise direction at the one side of the foresaid main body (MB), and being shipped out as final products. Description about the wafer storage (WS) which is provided between the treatment devices (EM), wherein the wafers (WF) having completed primary treatment are staying for transferring to the other semiconductor process equipment (BS) will be omitted.

However, when foreign substances such as process gases and fume and the like remaining on the wafer are being removed by the wind power of the exhaust device (FS) provided at the upper side of main body (MB) of the foresaid treatment device (EM), since during the process of stacking wafers (WF) into the foresaid load port (LP), foreign substances such as process gases and fume and the like floating inside the treatment device (EM) are being flowed inside the side storage (ST) which performs purge operation, thereby contacting the wafers that had been completed purge operation causing secondary contamination problem.

Furthermore, there is a problem that the maintenance cost of the foresaid exhaust device becomes expensive since the power consumption in driving the electric motor is extremely high.

Moreover, there is another problem that the lifetime of the foresaid exhaust device is shortened due to the electrical failure thereof since it is an electrical product driven by electricity.

SUMMARY OF INVENTION

Technical Problem

The present invention has been devised to solve the above described problems of the prior art, an objective of the present invention is to prevent secondary contamination of the wafers by not allowing the contact between foreign substances such as process gases and fume and the like floating inside the wafer treatment device with the wafers inside the side storage.

Another objective of the present invention is to provide an exhaust device which can be used almost semi-permanently with no failures, by using compressed air in the air exhausting process thereof.

Solution to Problem

The present invention for achieving such objectives relates to an exhaust system of a wafer treatment device, wherein said wafer treatment device is provided with: a semiconductor process equipment sequentially performing an ion implantation process for injecting impurities on the wafer surface, a thin film deposition process, an etching process, and a planarization process; a main body provided at one side of the foresaid semiconductor process equipment so that foreign substances such as process gases and fume and the like remaining on the surface of the wafer that had been completed processes in the foresaid semiconductor process equipment; at least one transfer devices for transferring the foresaid wafers inside the foresaid main body; a side storage provided at one end of the foresaid main body wherein wafers are multiply stacked; an exhaust device provided in the foresaid main body for removing foreign substances from the surfaces of the wafers multiply stacked inside of the foresaid side storage; and a plurality of load ports provided in lengthwise direction of the foresaid main body for shipping out multiply stacked wafers from where foreign substances had been removed in the foresaid side storage as final products, wherein
said wafer treatment device includes a cleaning device for removing the foreign substances such as process gases and fume and the like remaining on the wafers provided for said semiconductor process equipment; and wherein the foresaid exhaust device includes: a first body provided at the lower side of the main body of the foresaid wafer treatment device and having an inlet formed in the center thereof so that an air containing foreign substances emitted by the foresaid cleaning device can be flowed in; a receiving portion comprising a circular concave slot so that the lower outer side of the foresaid first body can be inserted therein; a circulation portion comprising a circular concave groove formed inside the foresaid receiving portion when viewed from the cross-section; an air supply hole formed along the right angle direction with respect to the foresaid circulation portion; an air exhaust hole circularly formed inside the cross-sectional view of the foresaid circulation portion, wherein the upper end thereof is formed at a lower position than the upper surface of the foresaid receiving portion when viewed from the cross-section so that it is spaced apart from the lower side of the foresaid first body by a predetermined distance; and a second body comprising an expanding portion where the internal diameter is expanding when viewed from the cross-section so that the injected air through the foresaid air exhaust hole is being diffused.

In addition, the foresaid cleaning device includes a side cleaning device and a backside cleaning device; wherein said side cleaning device includes: a plurality of wafer support members provided with horizontally symmetric ribs so that each of said multiply stacked wafers can be stacked spaced apart by a predetermined distance; and a plurality of spacers provided with a plurality of injection holes located at one side thereof and equally spaced apart for injecting purge gas towards the right angle direction with respect to said purge gas inlet holes and a plurality of purge gas inlet holes alternately provided along the up-down vertical direction with respect to the wafer supporting members, into which the purge gas is being flowed in; and said backside cleaning device located at the ends of said side cleaning devices along the right angle direction thereof includes: a plurality of injection holes provided equally spaced along the lengthwise direction at the same level of the injection holes of said spacers; and at least one purge gas inlet hole provided at the ends thereof.

In addition, the foresaid backside cleaning device further includes a plurality of arc-like concave grooves at the one side wherein the foresaid injection holes are formed for preventing an interference with the foresaid wafers.

In addition, the foresaid backside cleaning device includes: at least one sensing means provided at the side surface of the foresaid wafer support members and the spacers which are alternately provided along the up-down direction; a controller which senses electrical signals from the foresaid sensing means; and a plurality of air pressure blocks wherein a plurality of outlets are provided for selectively opening and closing thereof according to the signals from the foresaid controller.

In addition, the purge gas inlet hole of the foresaid exhaust device further includes an inclined guide portion whose internal diameter gradually expands towards the inward flow direction of the purge gas which is exhausted from the foresaid cleaning device.

In addition, the foresaid circulation portion further includes a vortex forming portion which is formed at the lower portion when viewed from the cross-section so that the resistance of the air flow supplied through the foresaid air supply hole is minimized, thereby enabling rapid exhausting through the foresaid air exhaust hole.

In addition, the foresaid air exhaust hole further includes a vortex facilitating portion, which is formed to be a round shape when viewed from the cross-section, for facilitating vortex generated in the foresaid circulation portion and minimizing the resistance of the air flow.

In addition, the foresaid cleaning device is characterized and includes (two) side cleaning devices and a backside cleaning device, which are installed as hexahedral boxes at the both sides and the backside of the foresaid wafers, and a plurality of injection holes are formed at the sides facing the foresaid wafers, and a plurality of purge gas inlet holes are provided at any one surface among the 5 surfaces wherein the foresaid injection holes are not formed.

In addition, the foresaid cleaning device includes: (three) cases provided at both sides and backside facing the foresaid wafers, wherein one side of each case of the foresaid cases facing the foresaid wafers is opened, and a purge gas inlet hole is provided at any one side of the 5 unopened sides of each case; and a porous filter provided inside the foresaid case and ejects purge gas flowed in from said purge gas inlet holes.

Advantageous Effects of Invention

As described above, an exhaust system of a wafer treatment device according to the present invention, it is effective in that the secondary contamination of the wafers that have completed cleaning process can be prevented by not allowing contact between the foreign substances such as process gases, fume and the like floating inside the wafer treatment device and the wafers inside the side storage.

Furthermore, it is effective in that exhaust devices which can be used almost semi-permanently with no failures can be widely supplied by using compressed air in the air exhausting process thereof.

BRIEF DESCRIPTION OF DRAWINGS

FIG. 2 is a plan view of an exhaust system of a wafer treatment device according to the present invention.

DETAILED DESCRIPTION OF EMBODIMENTS

Figure 1A:
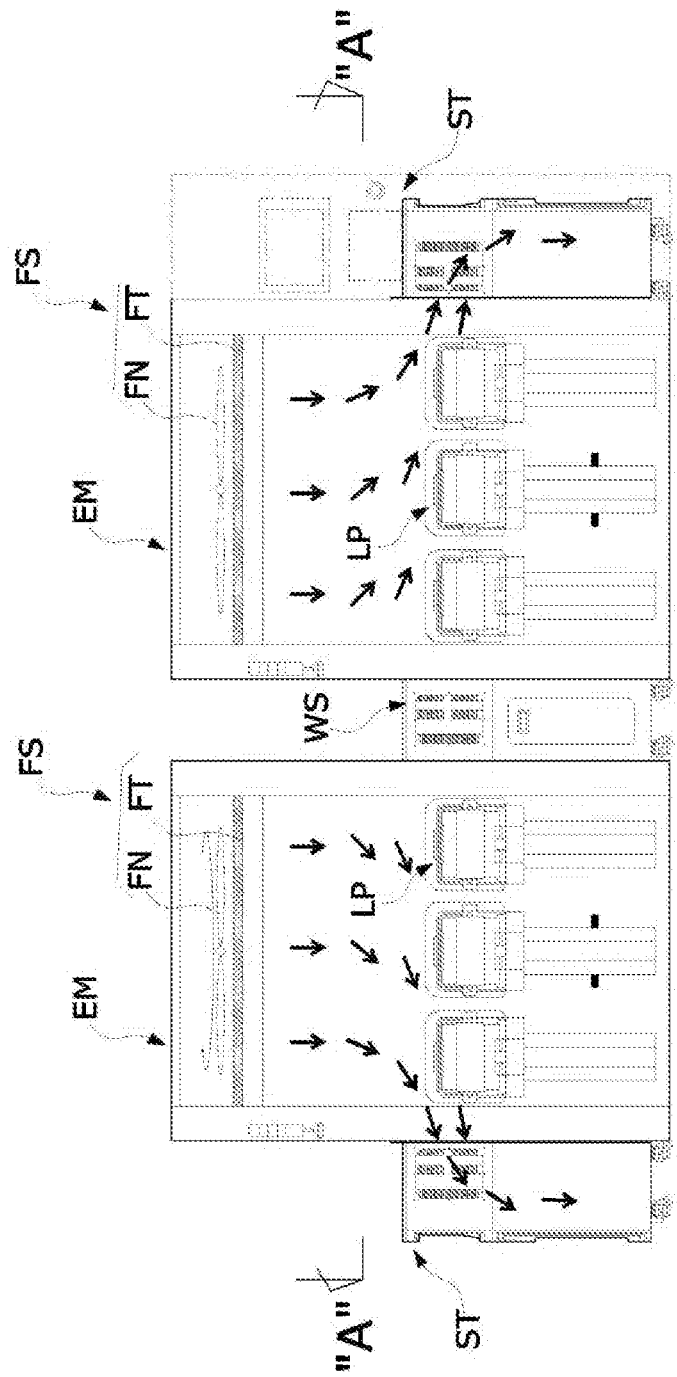
FIG. 1A is a perspective view of a wafer treatment device of the prior art.
Figure 1B:
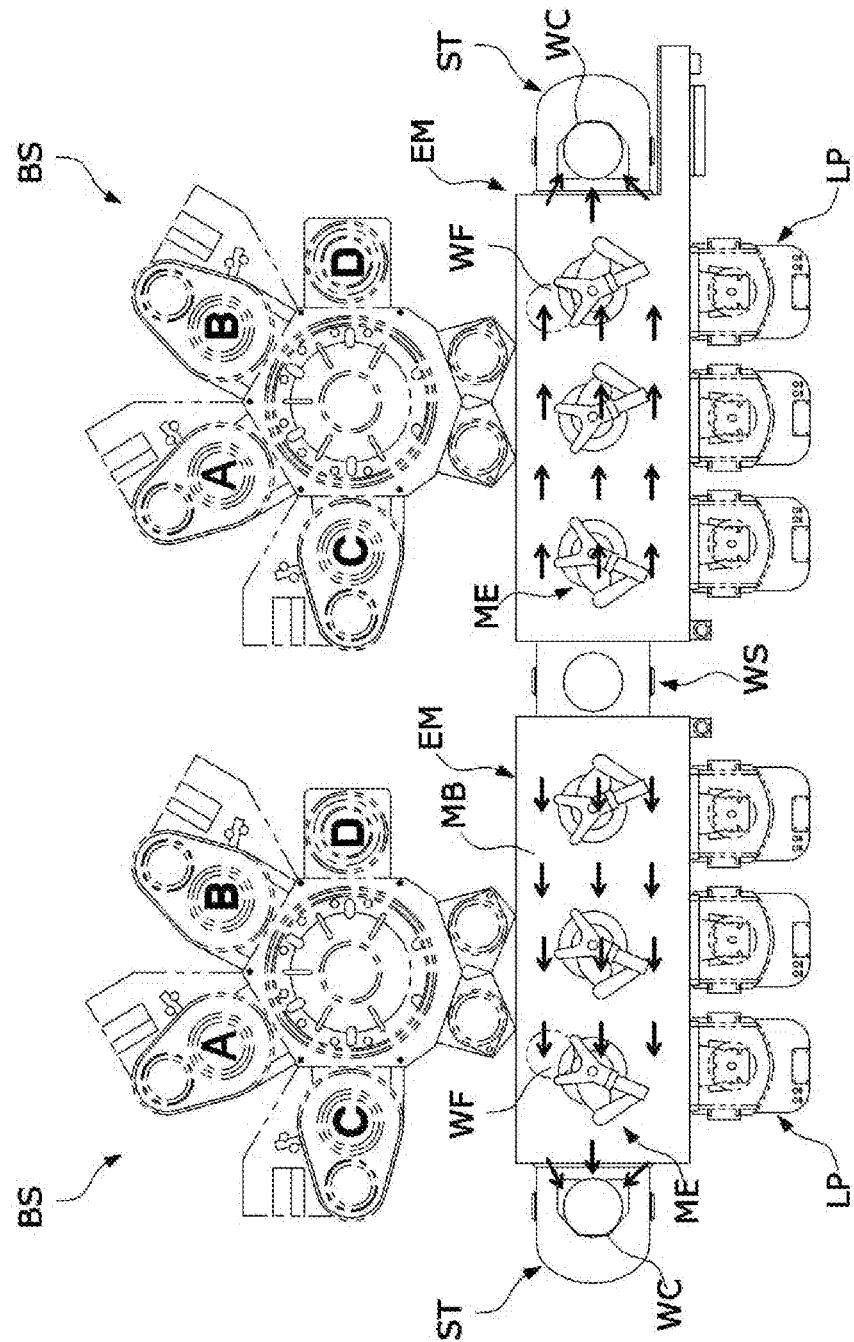
FIG. 1B is a cross-sectional view along the line "A"-"A" in FIG. 1A, a plan view of the wafer treatment device.
Figure 3:
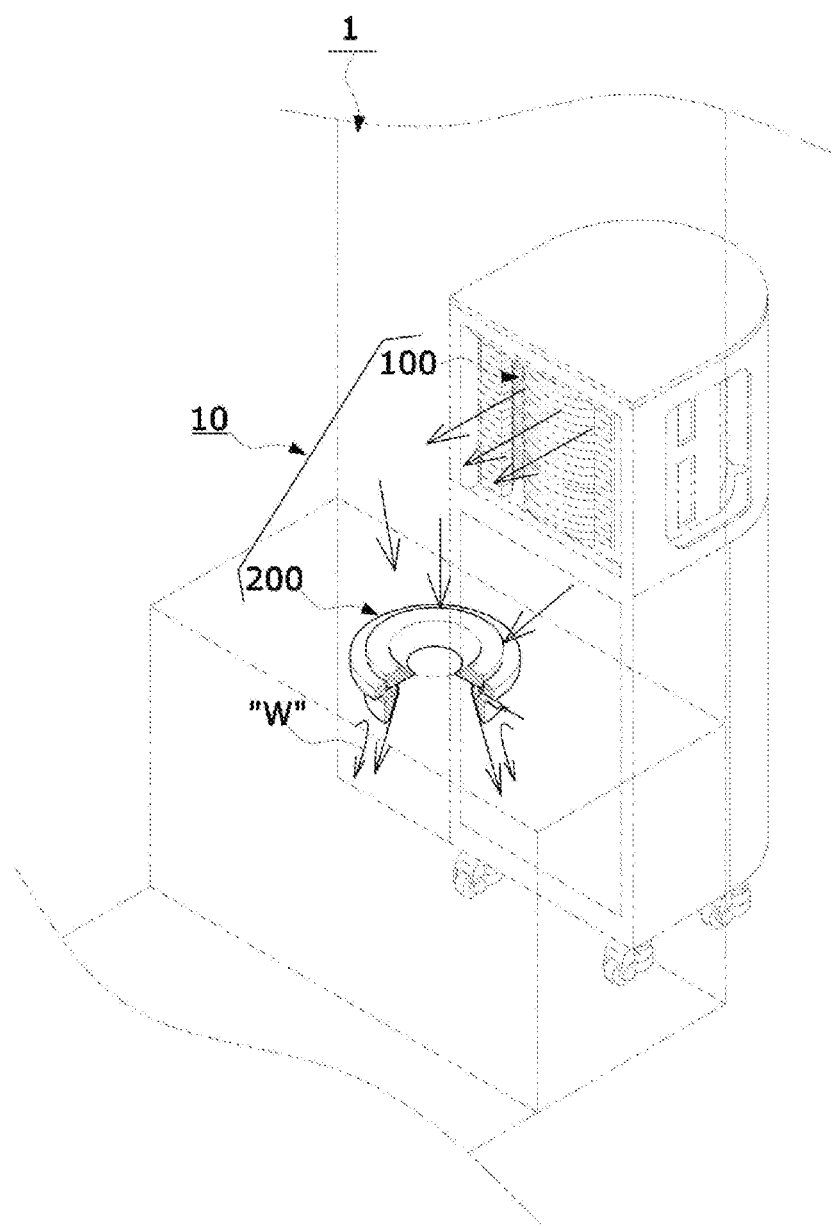
FIG. 3 is a perspective view of an exhaust system of a wafer treatment device according to the present invention.
Figure 4:
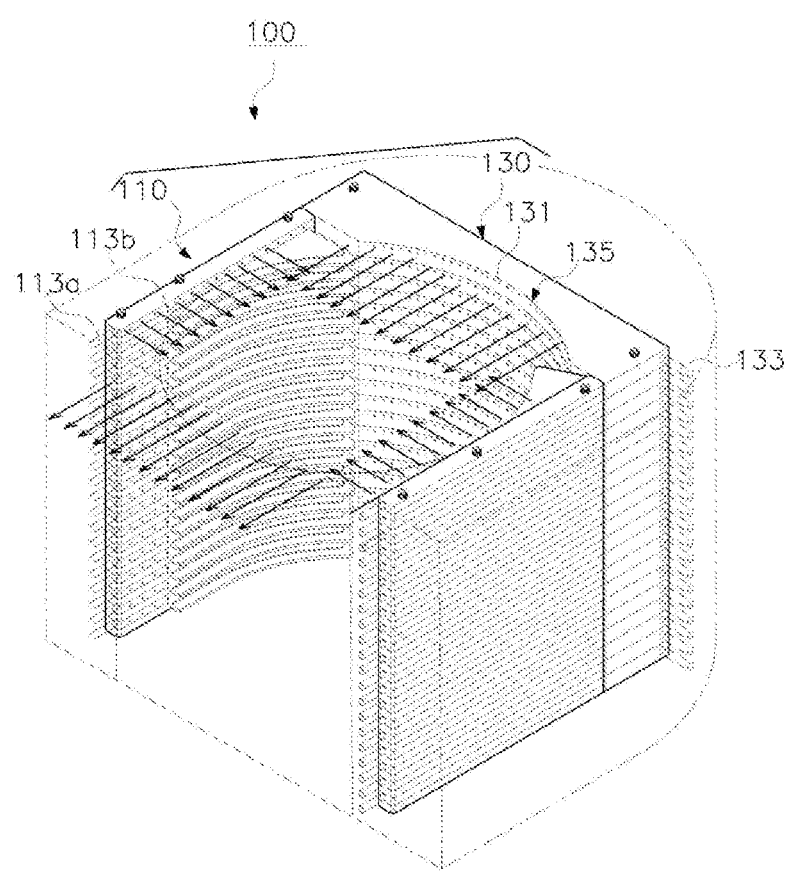
FIG. 4 is a perspective view of a cleaning device of an exhaust system of a wafer treatment device according to the present invention.

Referring to FIGS. 2 to 4, an exhaust system 10 of a wafer treatment device 1 according to the present invention is divided roughly into a cleaning device 100 and an exhaust device 200.

The cleaning device 100 is comprised of a side cleaning device 110 and a backside cleaning device 130.

Figure 5:
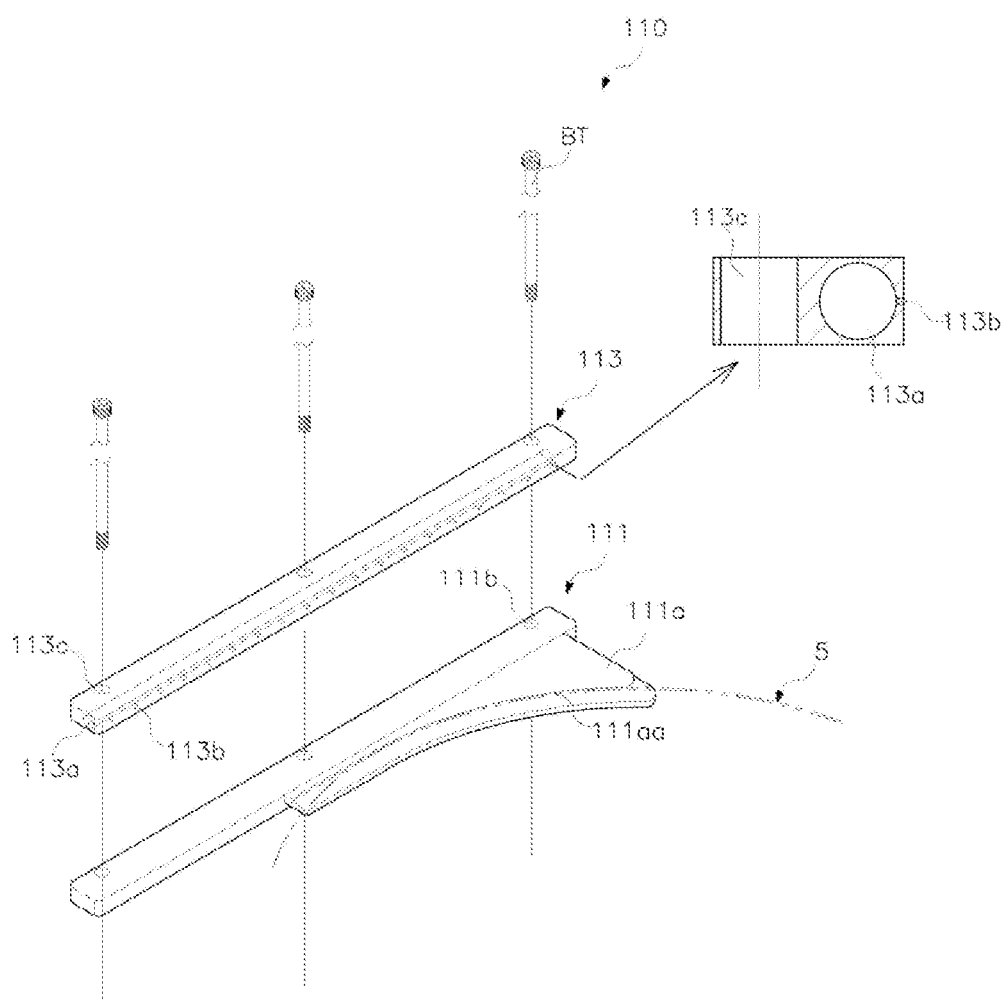
FIG. 5 is an exploded perspective view illustrating a wafer support member and a spacer which are the components of the cleaning device of an exhaust system according to the present invention.

Referring to FIG. 5, the side cleaning device 110 is comprised of a wafer support member 111 and a spacer 113.

The wafer support member 111 is provided with a rib 111a and a through hole 111b.

Along the rim of the rib 111a, a step 111aa is formed for facilitating the reception of the wafer 5 which is being inserted from the side of the rib.

Preferably, the step 111aa is formed in a way that the wafers 5, stacked in the operation which will be described later, are not to be protruded above the upper side of the step.

A plurality of through holes 111b are formed equally spaced apart in the lengthwise direction in order to facilitate bolt (BT) coupling with a plurality of spacers 113 which will be described later.

As illustrated, the spacer 113 is provided at the upper side of the wafer support member 111.

The spacer 113 is shaped like a bar having a rectangular cross-section when viewed from the cross-section, wherein a purge gas inlet hole 113a is provided in the length direction at the one side thereof (spacer), into which the purge gas emitted from the air pressure block 190 which will be described later, is injected; and a plurality of outlet holes 113b are formed at one side of the purge gas inlet hole 113a towards the right angle direction with respect to the purge gas inlet hole and equally spaced apart.

The purge gas ($N_2$ gas) is separately emitted only through the injection holes 113b facing the wafer 5 by directly connecting the foresaid purge gas inlet hole 113a to the corresponding one of the emission holes 191 in the air pressure block 190 which will be described later.

A plurality of through holes 113c are formed equally spaced apart in the lengthwise direction of the spacer 113 at the location where the center thereof coincides with the center of the through hole 111b of the foresaid wafer support member 111 in order to facilitate bolt (BT) coupling.

A plurality of stacked wafers 5 can be cleaned by vertically repeating the configuration comprising a pair of the wafer support member 111 and the spacer 113 many times.

A backside cleaning device 130 is provided at the one end of the side cleaning device 110 based on the foresaid configuration, that is, towards the backside direction with reference to the direction illustrated in FIG. 4

A plurality of backside cleaning devices 130 are provided in a stacked form at each end of the foresaid side cleaning devices 110 so that they form right angles with the foresaid back side cleaning devices 130, a plurality of injection holes 131 are formed equally spaced apart in the length direction at the same level with the injection holes 113b of the foresaid spacer 113.

Figure 6:
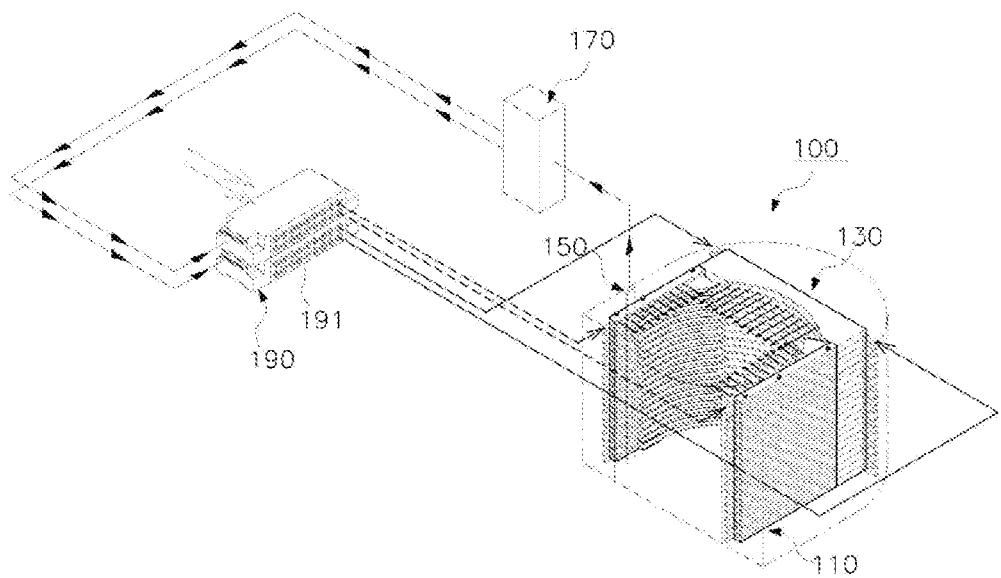
FIG. 6 is a perspective view illustrating overall configuration of a cleaning device according to the present invention.

In addition, at least one purge gas inlet hole 133 is provided at the end of the backside cleaning device 130, and the foresaid purge gas inlet hole 133 may be arranged with a pipe after adding a separate air pressure block 190 as illustrated in FIG. 6, or arranged with a pipe which is split (branched) off from the line connected to the purge gas inlet hole 113a of the foresaid spacer 113.

An arc-like concave groove 135 is formed in the surface, where the foresaid injection holes 131 are formed therein, in order not to interfere with the wafer 5 stacked in the operation which will be described later.

Meanwhile, a cleaning device 100 of the present invention further includes a sensing means 150, a controller 170, and an air pressure block 190.

At least one sensing means 150, which is an optics sensor, is provided along the vertical direction wherein a plurality of the foresaid spacers 113 and the wafer support members 111 are alternately provided.

When the wafers 5 are stacked on the wafer support member 111 of the cleaning device 100 according to the present invention, it is detected by the sensing means 150 and an electrical signal is generated for the controller 170.

At this time, the controller 170 is programmed so that the purge gas is emitted only to the corresponding side, that is, the portion where the wafers 5 of the corresponding side and backside cleaning devices 110 and 130 are provided according to the detected electrical signal in the foresaid sensing means 150.

Thus, according to this programming, the emission holes 191 of the air pressure blocks 190 supplies purge gas to the corresponding purge gas inlet holes 113a and 133 of the side and backside cleaning devices 110 and 130 respectively. This supplied purge gas is emitted from the each of the injection holes 113b and 131.

An exhaust device 200 is provided at one side of the foresaid cleaning device 100.

Figure 7:
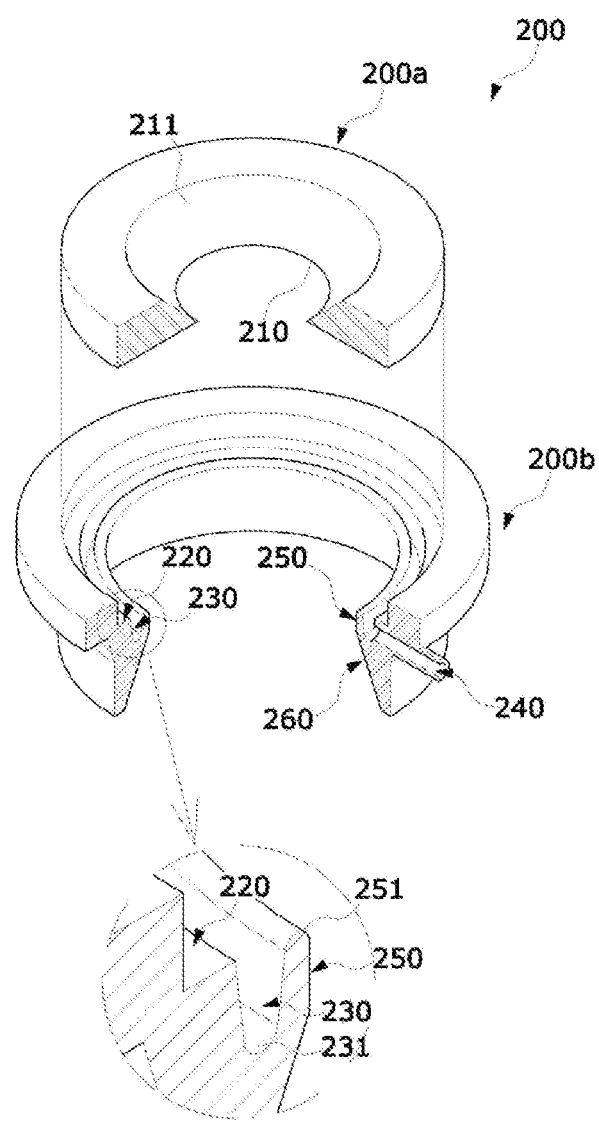
FIG. 7 is a perspective view illustrating an exhaust device which is a component of an exhaust system according to the present invention.
Figure 8:
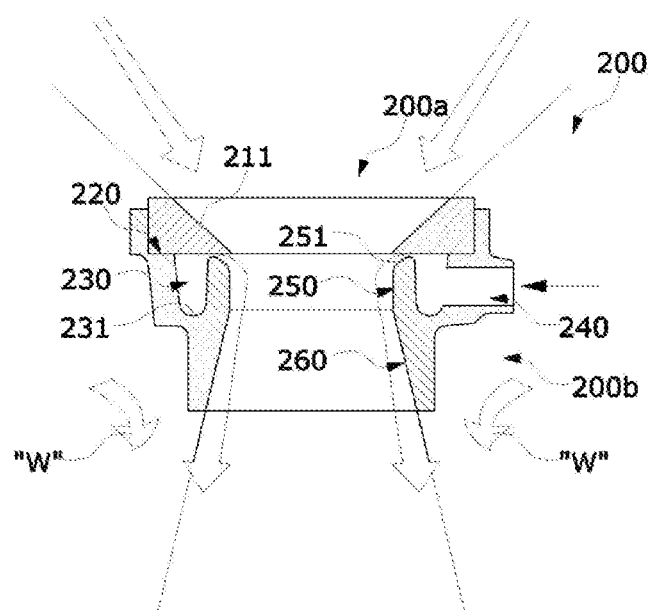
FIG. 8 illustrates an operation of an exhaust device according to the present invention.

Referring to FIGS. 7 and 8, the exhaust device 200 comprises a first body 200a and a second body 200b.

The first body 200a is formed to be a disk-like shape, wherein an inlet hole 210 is formed in the center thereof so that the purge gas generated from the foresaid cleaning device 100 can be flowed in.

An inclined guide portion 211, which is gradually getting wider as it approaches from the lower side towards the upper side with reference to the direction illustrated in the accompanying drawings, is formed in the inlet hole 210. Preferably the inclined guide portion 211 is formed to have a larger angle if possible so that the maximum amount of external air may be flowed in.

The foresaid first body 200a is coupled to the second body 200b. The second body 200b is comprised of a receiving portion 220, a circulation portion 230, an air supply hole 240, an air exhaust hole 250, and an expanding portion 260.

The receiving portion 220 is formed to be a circular concave groove so the external side of the lower portion of the foresaid first body 200a can be inserted therein.

The circulation portion 230 is formed to be a circular concave groove inside of the foresaid receiving portion 220 when viewed from the cross-section, and a vortex forming portion 231 having a half-circle shape when view from the cross-section is formed in the lower portion of the concave groove with reference to the direction in the accompanying drawings.

The vortex forming portion 231 minimizes the resistance of the air flow being supplied into the air supply hole 240 which will be described later, and the cross-section thereof is formed to be a half-circle shape so that the air flow is rapidly exhausted through the air exhaust hole 250, thereby facilitating the formation of the vortex.

The air supply hole 240 is formed in only one location towards the right angle direction with respect to the foresaid circulation portion 230, and the compressed air of the air compressor is supplied by coupling the nipple, not shown here and a piping material, thereto.

It will not be a problem if the air supply hole 240 is installed only in one location since the circulation of the air is being smoothly performed in the foresaid circulation portion 230.

Meanwhile, the upper end of the air exhaust hole 250 is formed in a lower position than that of the upper surface of the receiving portion 220 when viewed from the cross-section so that it is spaced apart a predetermined distance from the lower side of the foresaid first body 200a, and the upper end is a round shape when viewed from the cross-section wherein a vortex facilitating portion 251 is formed.

The vortex facilitating portion 251 is also a round shape when viewed from the cross-section so that the compressed air supplied into the foresaid air supply hole 240 facilitates vortex formed in the circulation portion 230, and the resistance of the air flow is minimized.

In this way, the air exhausted through the air exhaust hole 250 is more expanded through the expanding portion 260.

As the internal diameter of the expanding portion 260 is gradually expanding as it travels downward direction as illustrated in the drawings, the compressed air expands, and this expanded compressed air absorbs not only the air in the expanding unit 260 of the exhaust device 200 according to the present invention, but also the air floating around thereof (refer to "W" in FIGS. 3 and 8), and they are exhausted through the duct which is not shown here.

Next, referring to FIGS. 3 to 8, the operation and the effect of the exhaust system 10 will be described.

Firstly, a plurality of wafers 5 to be cleaned is supplied to the cleaning device 100 according to the present invention.

At this time, it is detected by the sensing means 150 provided at one side of the cleaning device 100 in the vertical direction, and this detected signal is transferred to the controller 170.

The controller 170 performs the pre-installed program according to the signal transferred thereto, then any one of the emission holes 191 of the air pressure block 190 is opened so that the purge gas is supplied only to the side and the backside exhaust devices 110 and 130 wherein the corresponding wafers are inserted, and the purge gas is injected through the injection holes 113b and 131 respectively.

In this way, the cleaning device 100 according to the present invention injects purge gas only into the side and the backside exhaust devices 110 and 130 which are provided with the wafers 5 according to the detected signal of the sensing means 150, and thereby the cleaning operation for the wafers 5 are performed.

Accordingly, the purge gas containing the foreign substances such as process gases and fume remaining on the wafers 5 are flowing into the main body of the wafer treatment device 1 through the side storage (ST), and this purge gas is exhausted through the exhaust device 200 according to the present invention.

Referring to FIGS. 3 and 8, in the exhaust device 200 according to the present invention, the compressed air supplied form the air compressor, which is not shown here, is being supplied through the air supply hole 240 according to the present invention.

The compressed air circulates inside the circulation portion 230 of a circular shape when viewed from the top, and the vortex generated in the vortex forming portion 231 provided at a lower portion of the circulation portion 230 is rapidly exhausted through the air exhaust hole 250 which is spaced a predetermined distance apart from the lower portion of the first body 200a.

This air exhaust hole 250 also comprising a vortex facilitating portion 251 which is formed to be a round shape in order to minimize the resistance of the compressed air wherein vortex is formed.

In this way, the air flow accelerated by the vortex is expanded and exhausted through the expanding portion 260 with no resistance.

In other words, the air flowed in with a constant speed is expanded and exhausted with a more faster speed due to the vortex formed by the reactions of the circulation portion 230, the air exhaust hole 250, the expanding portion 260, and the like in the exhaust device 200 according to the present invention as described above.

The purge gas, which is exhausted into the main body of the wafer treatment device 1 from the foresaid cleaning device 100 by the wind speed and the wind pressure of the compressed air exhausted by such reactions, is flowed into the inlet hole 210 of the first body 200a of the exhaust device 200, is exhausted through the duct, which is not shown here, together with the compressed air exhausted at a high speed through the expanding portion 260, as described above.

Thus, the cleaning device 100 and the exhaust device 200 prevent the secondary contamination of the wafers 5 occurring during the process of transferring them from the side storage to the load port by exhausting the purge gas, which contains the foreign substances such as process gases and fume and the like remaining on the wafer, from the side storage, and at the same time, towards the outside of the wafer treatment device.

Further, the air, which is expanding and rapidly exhausting through the expanding portion 260 of the exhaust device 200 according to the present invention, also absorbs the adjacent floating air (Refer to "W" in FIGS. 3 and 8) and exhausts them through a duct (not shown here).

In addition, the exhaust device 200 according to the present invention is capable of exhausting the adjacent air without a separate power source. Therefore, the maintenance cost in operating the wafer treatment device 1 is saved.

Furthermore, since the equipment does not require a power supply for the operation thereof, it can be used almost semi-permanently with no failures. The exhaust efficiency of the purge gas is enhanced by absorbing the air floating around the corners of the semiconductor process equipment owing to the circulation portion 230, the air exhaust hole 270, the expanding portion 290, and the like as described above.

Figure 9:
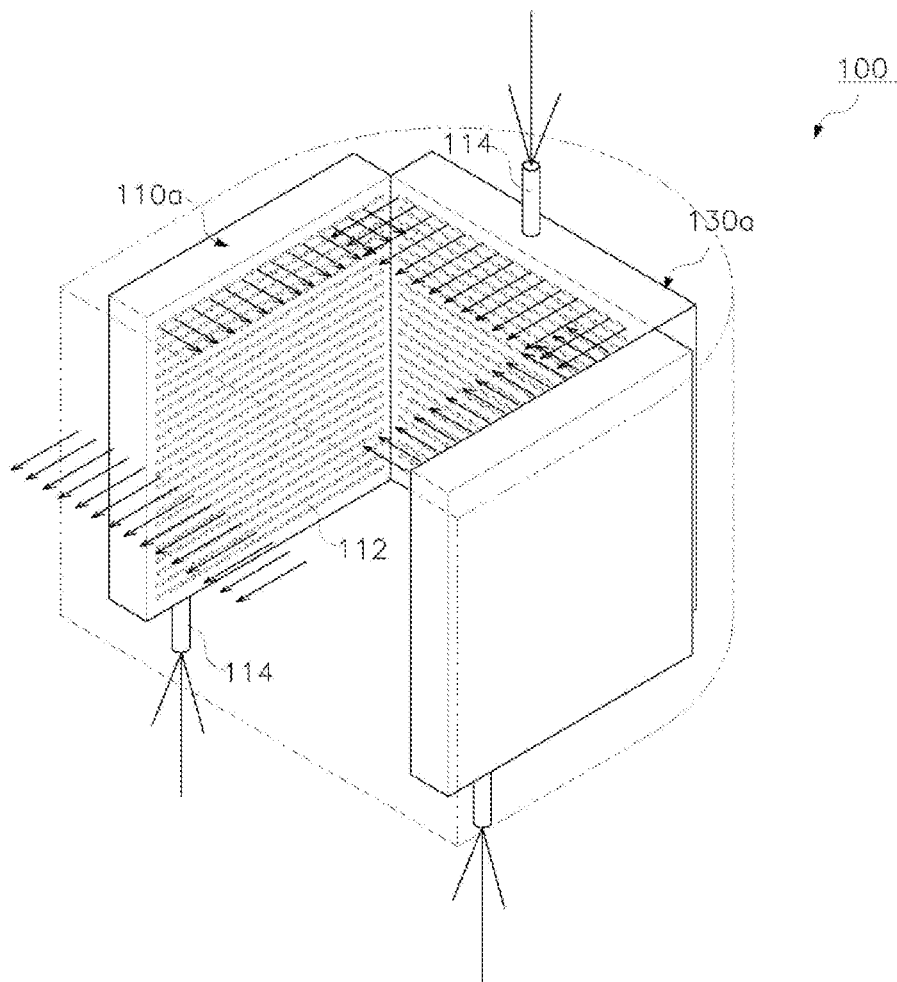
FIG. 9 is a perspective view illustrating another exemplary embodiment of a cleaning device according to the present invention.

Another exemplary embodiment of a cleaning device 100 according to the present invention is illustrated in FIG. 9.

Referring to FIG. 9, a cleaning device 100 of another exemplary embodiment of the present invention is comprised of two side cleaning devices 110a and a backside cleaning device 130a. (Hereinafter, it will be described with the identical names that are used in the previous exemplary embodiment of the present invention except the numerical symbols for the convenience of description. Only about the side cleaning device 110a will be described since the side and the backside cleaning devices 110a and 130a according to this exemplary embodiment of the present invention are comprised of identical elements except the installed positions thereof.)

The side cleaning device 110a combines stainless steel board panels into a hexahedral box shape wherein a plurality of injection holes 112 are formed, and a purge gas inlet hole 114 is provided in one surface among the five surfaces having no foresaid injection holes 112.

Accordingly, the purge gas ($N_2$ gas), which is flowed in through the purge gas inlet hole 114, is flowed into inside the side and the backside cleaning devices 110*a* and 130*a* which are shaped like a box. Then the purge gas of a uniform pressure is injected from the both side surfaces and the backside surface through the foresaid injection holes 112 by the pressure of the purge gas.

In this way, the injected purge gas is exhausted through a duct, which is not shown here, by the exhaust device 200 of the foresaid exemplary embodiment containing the foreign substances such as fume and the like remaining on the wafers which are multiply stacked in a cassette which is not shown here.

Figure 10:
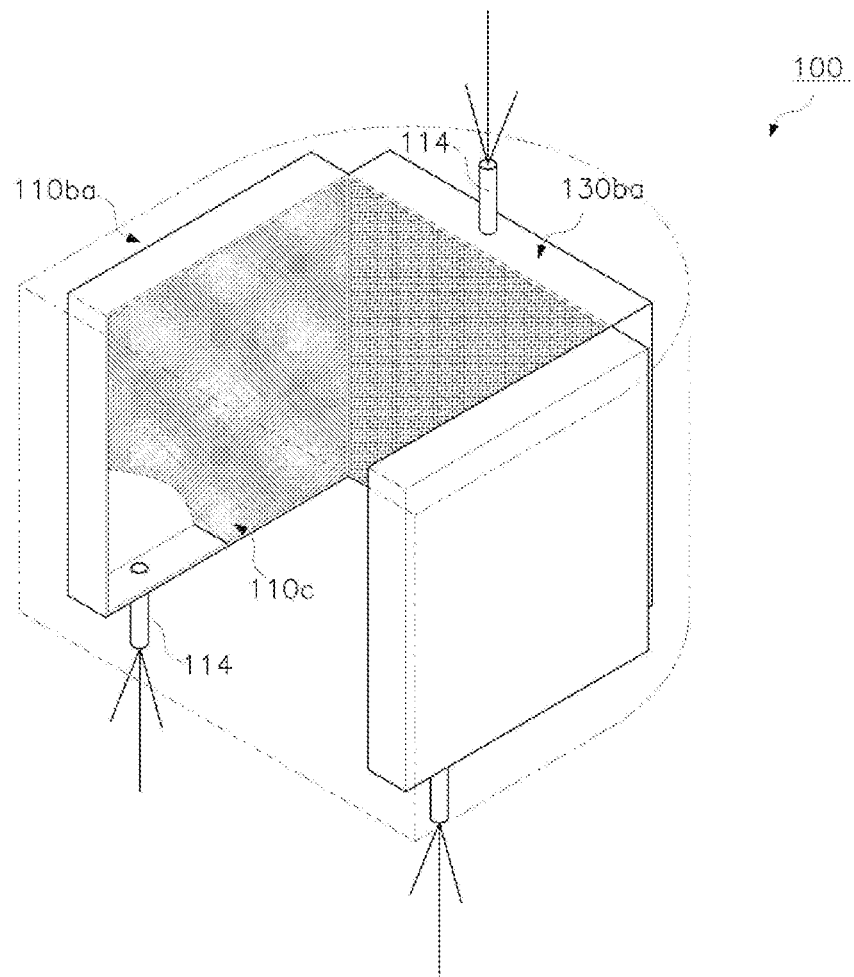
FIG. 10 is a perspective view illustrating yet another exemplary embodiment of a cleaning device according to the present invention.

Yet another exemplary embodiment of a cleaning device 100 according to the present invention is illustrated in FIG. 10.

Referring to FIG. 10, a case 110*ba*, which resembles a rectangular container having one open side, is provided in a side cleaning device 110*b*. A porous filter 110*c* is provided inside the case 110*ba*, and a purge gas inlet hole 114 is provided in one surface among the five closed surfaces.

Thus, the purge gas ($N_2$ gas) which is supplied through this purge gas inlet hole 114 is uniformly injected through the minute holes which are formed in the porous filter 110*c*, and exhausted through a duct, which is not shown here, by the exhaust device 200 of the foresaid exemplary embodiment containing the foreign substances such as fume and the like remaining on the wafers which are multiply stacked in a cassette which is not shown here.

The foresaid porous filter 110*c* is a material wherein a numerous air holes are formed by compressing fibers or powders with a constant pressure and sintering thereof.

Meanwhile, a signal detected by the sensing means, which is not shown here, is transferred to a controller, which is not shown here, and then, the purge gas ($N_2$ gas) is injected by the controller in same way as described in the previous exemplary embodiment.

The present invention is not limited to the foresaid specific preferred exemplary embodiments, and it is apparent that various modifications are possible for any ordinary person of skilled in the art without departing the gist of the present invention as claimed in the accompanying claims, and such modifications are residing in the scope of claims of the present invention.

The invention claimed is:

1. A wafer treatment device, comprising:
   a wafer cassette; and
   a plurality of cleaning devices provided in the wafer cassette,
   wherein each cleaning device comprises a wafer support member and a spacer, the wafer support member including a rib extending in a horizontal direction so as to support a wafer, the spacer being disposed directly between two wafer supporting members,
   wherein the plurality of cleaning devices are arranged in a vertical direction and are fixed by a bolt in the vertical direction,
   wherein each spacer includes:
     a purge gas inlet hole;
     a side surface; and
     a plurality of first injection holes arranged on the side surface and connected with the purge gas inlet hole,
   wherein the purge gas flows out through the plurality of first injection holes into the wafer cassette,
   wherein each purge gas inlet hole is connected to a corresponding emission hole of an air pressure block emitting the purge gas,
   wherein the emission holes of the air pressure block supply the purge gas to the corresponding purge gas inlet holes, and
   wherein the purge gas supplied through the emission holes of the air pressure block is only emitted into the wafer cassette through the first injection holes, and each emission hole of the air pressure block can be selectively opened and closed independent of the other emission holes.

2. The wafer treatment device according to claim 1, further comprising:
   at least one sensor provided at a side of the wafer support member for detecting whether the wafer is loaded; and
   a controller configured to sense electrical signals from said sensor,
   wherein the emission holes of the air pressure block are selectively opened and closed according to said controller.

3. The wafer treatment device according to claim 1, wherein the purge gas inlet hole is provided in a longitudinal direction of said spacer within said spacer, and each of the plurality of first injection holes extends from the purge gas inlet hole in a perpendicular direction to the longitudinal direction of said spacer.

* * * * *